(12) United States Patent
Nakada et al.

(10) Patent No.: US 6,516,785 B1
(45) Date of Patent: Feb. 11, 2003

(54) AIR FLOW SENSOR

(75) Inventors: Keiichi Nakada, Hitachinaka (JP); Izumi Watanabe, Hitachinaka (JP); Hiroshi Yoneda, Hitachinaka (JP); Kei Ueyama, Hitachinaka (JP); Masamichi Yamada, Hitachinaka (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 09/763,967
(22) PCT Filed: Jul. 27, 2000
(86) PCT No.: PCT/JP00/05016
§ 371 (c)(1), (2), (4) Date: Feb. 28, 2001
(87) PCT Pub. No.: WO02/10694
PCT Pub. Date: Feb. 7, 2002

(51) Int. Cl.[7] .................................. G01F 1/692
(52) U.S. Cl. .............. 123/494; 73/118.2; 73/204.26
(58) Field of Search ............ 123/494; 73/204.25, 73/204.26, 118.2

(56) References Cited

U.S. PATENT DOCUMENTS

| 5,393,351 | A | * | 2/1995 | Kinard et al. | 73/204.26 |
| 5,452,610 | A | * | 9/1995 | Kleinhans et al. | 73/204.25 |
| 5,708,205 | A | * | 1/1998 | Yamada et al. | 73/204.26 |
| 6,101,872 | A | * | 8/2000 | Zechnall et al. | 73/204.26 |
| 6,357,294 | B1 | * | 3/2002 | Nakada | 73/204.26 |

* cited by examiner

Primary Examiner—Erick Solis
(74) Attorney, Agent, or Firm—Crowell & Moring LLP

(57) ABSTRACT

In a thermal air flow sensor, an air flow measuring element and an intake air temperature sensing element of an intake air temperature sensor are mounted on a single support member so as to be positioned within an intake passage. The support member is made of a glass-ceramic material for example and is held by a holder secured to the wall of an intake pipe. The support member has a structure whereby both sides of a portion of the support member located on the side away from the intake pipe wall are easy to be taken away their heat by an air flow moving through the intake pipe. The air flow measuring element and the intake air temperature sensing element are disposed on such a heat-removed surface of the support member and are electrically connected respectively to conductors disposed on the support member, with their electric connections being sealed with resin, whereby the intake air temperature sensor and the air flow sensor can be rendered integral with each other.

15 Claims, 16 Drawing Sheets

AIR FLOW

AREA EXPOSED TO AIR ←

AIR FLOW SENSOR

BACKGROUND OF THE INVENTION

1. Field of the Invention

The present invention relates to a thermal air flow sensor (air flow meter) for measuring the air flow (the amount of flowing) with use of a heating resistor. For example, the invention is concerned with an air flow sensor suitable for measuring the flow of intake air in an internal combustion engine.

2. Description of Related Art

As an air flow sensor installed in an intake passage of an internal combustion engine of an automobile or the like, a thermal type has come to be mainly adopted because it can detect a mass flow directly.

For example, such a thermal type air flow sensor uses, as air flow measuring elements, a heating resistor which makes heat exchange with intake air directly or indirectly and a resistor which compensates a change in air temperature at the time of measuring the air flow (sometimes also called a temperature compensating resistor, a thermal sensitive resistor, or a temperature measuring resistor), and controls an electric current flowing in the heating resistor so that a temperature difference between the heating resistor and the temperature compensating resistor becomes constant. This current value is converted into an electric signal to measure the air flow.

The heating resistor and the temperature compensating resistor have temperature dependence and for fabricating them there recently has been proposed a method of forming a thin film-like resistance area for air flow measurement on a semiconductor substrate such as silicon (Si) for example by using a micromachining technique for semiconductor. This method can mass-produce thermal air flow sensors relatively easily and is economical, so is now attracting attention as an air flow sensor capable of being driven with low electric power.

A semiconductor type air flow measuring device is disclosed, for example, in Japanese Patent Laid Open (Tokuhyo) No. 9-503310. According to the conventional technique disclosed in this publication, in a mass measuring apparatus for measuring an intake mass of an internal combustion engine, a sensor element is formed by etching a silicon wafer for example to form a diaphragm-like sensor region and forming plural resistance layers (one is a measuring resistor having temperature dependence and another is a heating resistor for heating the measuring resistor). As to a medium temperature resistance for compensating the temperature of a fluid medium, it is disposed on an outer surface of a casing of the mass measuring apparatus in order to avoid a thermal influence of the heating resistor.

According to another conventional technique, as disclosed, for example, in Japanese Patent Laid Open No. 2000-28411, a flow sensing section formed with a heating element and a temperature sensing element for flow measurement which is heated by the heating element, as well as a temperature sensing section formed with a temperature sensing element which makes air temperature compensation for flow measurement, are formed at one end of a substrate such as a silicon, alumina or glass substrate, and part of the substrate and output terminals are covered with a cover member by molding. In this conventional technique it is proposed to form a slit between the flow sensing section and the temperature sensing section for preventing the temperature sensing section from being thermally influenced by the flow sensing section.

In the thermal air flow sensor, as referred to above, a heating resistor and a temperature compensating resistor are used as air flow measuring elements.

In connection with an internal combustion engine, the supply of fuel is controlled in accordance with the value of air flow, but attempts have been made to utilize the intake air temperature in various automobile controls with use of an intake air temperature sensor. Examples include ignition timing control, boost pressure control for a turbo-charger, limiter control for fuel injection volume in rapid acceleration, and judgment as to whether the catalyst used has reached an active catalyst temperature.

SUMMARY OF THE INVENTION

It is an object of the present invention to provide an air flow sensor capable of being rendered integral with an intake air temperature sensor, thereby capable of attaining the reduction in the number of sensor components, reduction of cost and rationalization of the mounting work and mounting space, and further capable of keeping high the accuracy of the intake air temperature sensor.

It is another object of the present invention to provide a thermal air flow sensor which, even when an intake air temperature sensing element (the type of use does not matter specially) and a thermal air flow measuring element are mounted on a common support member in case of uniting the intake air temperature sensing element with the air flow sensor, can fully eliminate a thermal influence from a heating resistor and circuit section of the air flow measuring element and from an engine. Therefore it is to provide a thermal air flow sensor which can enhance the intake air temperature measurement accuracy and which can maintain the soundness of the intake air temperature sensing element even when placed in a metal corrosion inducing environment containing moisture present in the intake air, gasoline vapor, engine oil, and sulfurous acid gas and nitrogen oxides present in blow-by gas.

According to the present invention, for achieving the above-mentioned objects, there basically is provided a thermal air flow sensor having a thermal element for measuring the air flow flowing through an intake passage, the thermal air flow measuring element having a heating resistor and being disposed within the intake passage, wherein an intake air temperature sensing element used in an intake air temperature sensor is mounted on a single support member made of a glass-ceramic material etc together with the air flow measuring element and is positioned within the intake passage. Moreover, the air flow measuring element and the intake air temperature sensing element are electrically connected respectively to conductors disposed on the support member and the resulting electric connections are sealed with resin.

According to the present invention, moreover, there is adopted a structure wherein both sides of a portion of the support member located on the side apart from the wall of an intake pipe are easy to be taken away their heat by an air flow moving through the intake pipe. On such a heat-removed substrate side there are provided the air flow measuring element and the intake air temperature sensing element.

The present invention further proposes the following thermal air flow sensors.

One is a thermal air flow sensor having an intake air temperature sensing element, wherein this intake air temperature sensing element and the foregoing air flow measuring element are mounted on a single glass-ceramic or ceramic support member and are positioned within the intake passage, the support member is cantilevered by means of a holder attached to the wall of the intake pipe, and the intake air temperature sensing element is disposed at one end of the support member on the side opposite to the cantilevered side and at a position away from the holder with respect to the air flow measuring element. The air flow measuring element and the intake air temperature sensing element are electrically connected respectively to conductors disposed on the support member and the resulting electric connections are sealed with resin.

Another is a thermal air flow sensor having a structure whereby both sides of a portion of the support member located on the side away from the wall of the intake pipe are easy to be taken away their heat by an air flow moving through the intake pipe. On such a heat-removed support member side there are disposed the air flow measuring element and the intake air temperature sensing element.

A still another is a thermal air flow sensor wherein the air flow measuring element and the intake air temperature sensing element are respectively mounted in recesses formed each individually in the support member and are electrically connected respectively to conductors disposed on the support member. The resulting electric connections are sealed with resin.

DESCRIPTION OF THE PREFERRED EMBODIMENTS

Embodiments of the present invention will be described hereinunder with reference to the accompanying drawings.

Description will be directed first to a thermal air flow sensor according to the first embodiment of the present invention.

Figure 1:
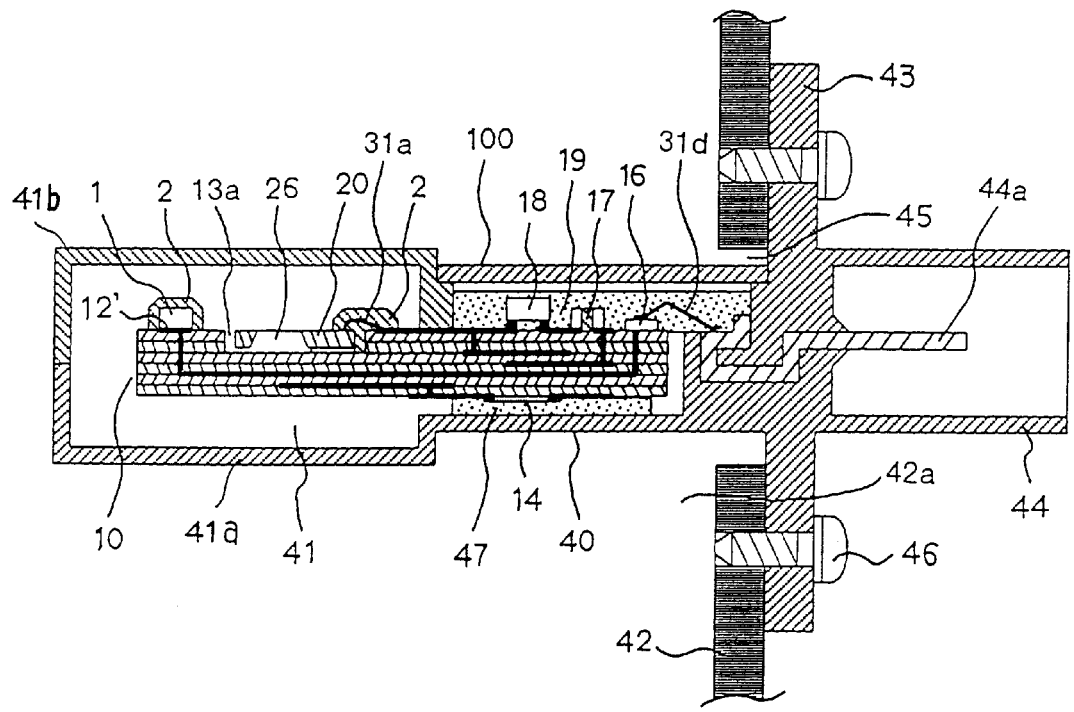
FIG. 1 is a longitudinal sectional view showing a state in which a thermal air flow sensor according to the first embodiment of the present invention has been installed in an intake passage of an internal combustion engine.

As shown in FIG. 1, the air flow sensor of this embodiment, indicated at 100, is provided with not only an air flow measuring element 20 but also an intake air temperature sensing element 1 which functions as an intake air temperature sensor. The intake air temperature sensing element 1 and the air flow measuring element 20 are mounted on a single support member 10 made of a glass-ceramic material so as to be positioned in a sub-passage 41 which is defined within an intake passage (intake pipe) 42a.

In the sub-passage 41, a portion (wall portion) 41a of the passage wall is integral with a holder 40 and the remaining passage wall (wall portion) 41b is combined with the passage wall 41a to constitute the sub-passage 41.

The support member 10 is cantilevered by the holder (air flow sensor housing) 40 which is secured to an intake pipe wall 42. The intake air temperature sensing element 1 is disposed at one end of the support member 10 on the side opposite to the cantilevered side and at a position away from the holder 40 with respect to the air flow measuring element 20. As. shown in FIG. 3, the intake air temperature sensing element 1 is located on an upstream side in the air flow direction with respect to the air flow measuring element 20.

Figure 2:
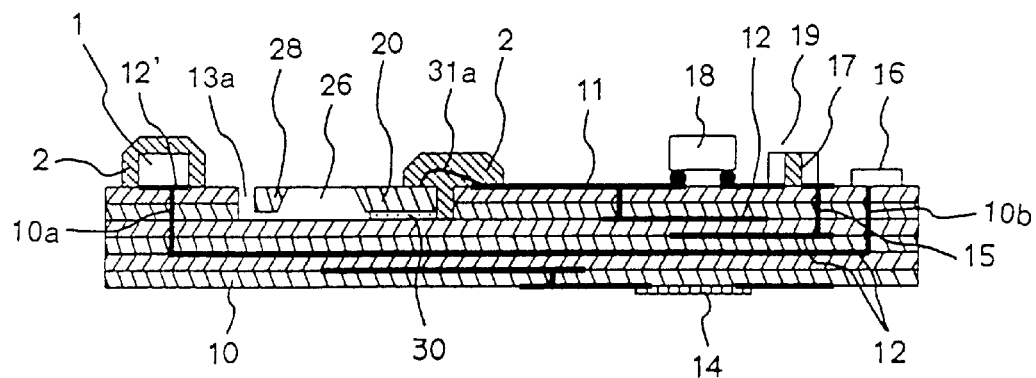
FIG. 2. is a longitudinal sectional view showing a state in which an air flow measuring element and an intake air temperature sensing element have been mounted on a support member (a laminate substrate) used in the first embodiment.
Figure 3:
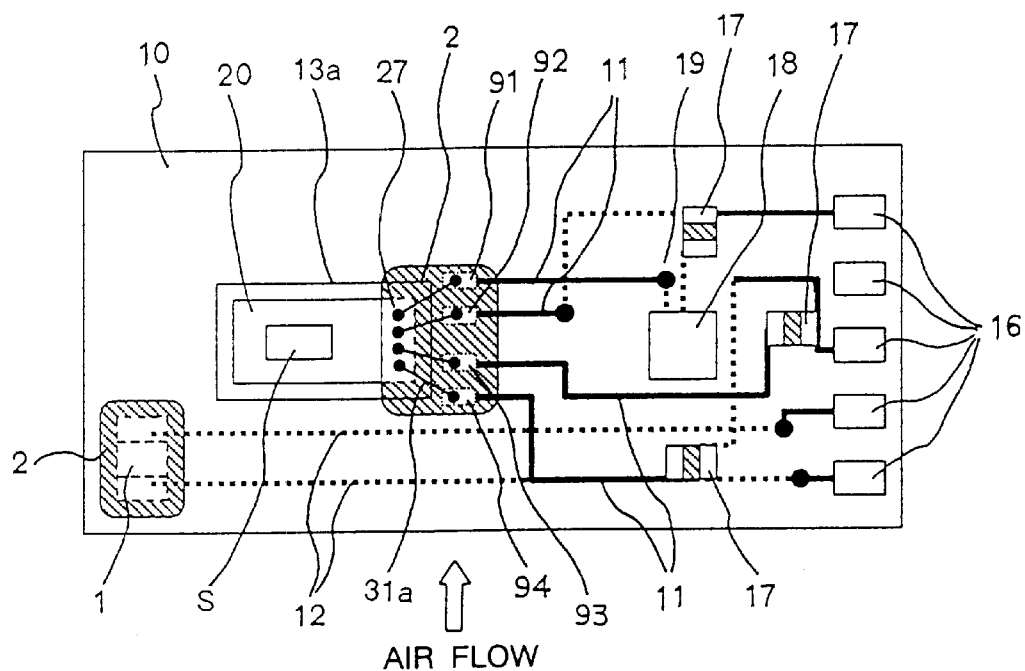
FIG. 3 is a plan view of FIG. 2.

As shown in FIGS. 2 and 3, the air flow measuring element 20 and the intake air temperature sensing element 1 are electrically connected at 31a and 12' to conductors 11 and 12 which are formed on the support member 10. The electric connections 31a and 12' are sealed with an insulating resin 2. As the resin there is used one of an epoxy resin, a fluorine-containing resin, and a glass material.

In this embodiment, as will be described in more detail later, the support member 10 is constituted by a laminate substrate and the conductor 11 is formed on the surface of the laminate substrate. But as to the conductor 12, it is interposed between layers of the laminate substrate 10 and one end thereof is exposed to the surface of the laminate substrate 10 at the installed position of the intake air temperature sensing element 1 through a via hole 10a formed in the laminate substrate. This exposed portion of the conductor 12 corresponds to the electric connection 12'. The details on the connection of the intake air temperature sensing element 1 will be described later with reference to FIG. 5.

The opposite end of the conductor 12 is electrically connected through a via hole 10b to a terminal 16 formed in a circuit section on the laminate substrate 10. The conductors 11 and 12 may hereinafter be sometimes designated a surface conductor and an inner conductor, respectively.

Terminals 27 (shown in FIG. 4) of a heating resistor 22 and a heat sensing resistor 23 are electrically connected to the support member 10-side conductor 11 (terminals 91~94) each by wire bonding 31a of gold wire for example.

The sub-passage (intake air measuring passage) 41 is cylindrical and is formed at one end (front end) of the holder 40, while at the opposite end of the holder 40 are mounted a flange 43 and a connector case 44. An area S (FIG. 3) of the support member 10 where the air flow measuring element 20 and the intake air temperature sensing element 1 are provided faces the interior of the sub-passage 41. One end of a pin terminal 44a of the connector case 44 is conducted to the holder 40 and is connected through wire 31d to a terminal 16 formed on the support member 10.

The holder 40 and the sub-passage 41 are set within the intake passage 42a through a mounting hole 45 formed in the intake pipe wall 42, and the air flow sensor 100 is secured to the intake pipe wall 42 through the flange 43.

Figure 4:
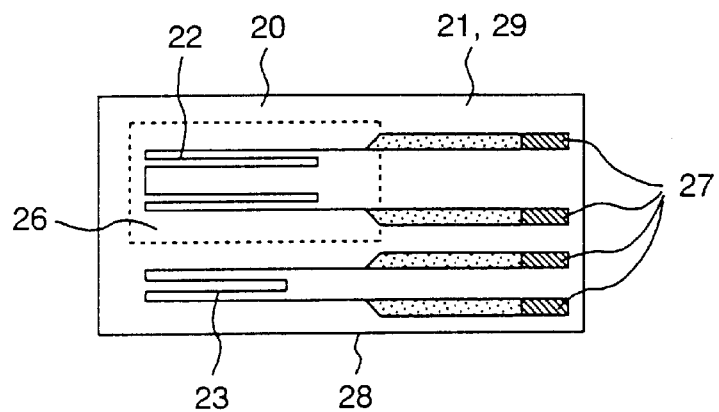
FIG. 4 is a plan view of the air flow measuring element used in the first embodiment.

Now, the thermal air flow measuring element 20 will be described below with reference to FIGS. 2 and 4.

The air flow measuring element 20 is fabricated by the micromachining technique for semiconductors. More specifically, an electric insulating layer 21 is formed on a single crystal silicon substrate 28 and at least one heating resistor 22 and a temperature sensing resistor 23 are formed thereon by patterning. The resistor forming area corresponds to the area indicated by the reference mark S in FIG. 3. Below (on the back side) the area of the single crystal silicon 28 with the heating resistor 22 formed therein is formed a cavity 26 by removing the substrate 28 up to the electric insulating layer 21 in accordance with an anisotropic etching technique. According to such a structure, the heating resistor 22 is insulated thermally, whereby it becomes possible to let the resistor generate heat while saving power and hence possible to effect an air flow detection utilizing the heat exchange with air flow.

The following description is now provided about a manufacturing process for the air flow measuring element 20. A silicon dioxide layer is formed as the electric insulating layer 21 on the single crystal silicon substrate 28 by, for example, thermal oxidation or CVD (Chemical Vapor Deposition) and thereafter a silicon nitride layer is formed by CVD for example. Next, a polycrystalline silicon layer is formed by CVD for example, followed by doping of phosphorus (P) as impurity by thermal diffusion or by ion implantation. Thereafter, the heating resistor 22 and the temperature sensing resistor 23 are formed by patterning the polycrystalline silicon layer.

Next, a silicon nitride layer is formed as a protective layer 29 and thereafter a silicon dioxide layer is formed, both by CVD for example. Subsequently, the protective layer 29 is subjected to patterning in the same way as above to remove the protective layer portion where electrodes 27 are to be formed. Then, an aluminum layer is formed and patterning is performed by etching. Lastly, for forming the cavity 26, a silicon nitride layer is formed by CVD for example on the surface portion of the single crystal silicon 28 where the heating resistor 22 is not formed, followed by patterning. Thereafter, the cavity 26 is formed by anisotropic etching, followed by dicing for division into chips. The air flow measuring element 20 thus obtained by the division is, for example, 6 mm long by 2.5 mm wide by 0.3 mm thick.

Reference will be made below to the process for fabricating the laminate substrate serving as the support member 10. In this example, the support member 10 is constituted by a laminate substrate of a glass-ceramic material.

First, a desired number of glass-ceramic sheets about 0.1 to 0.3 mm thick, which are in a state of green sheets, are laminated together in close contact with one another under the application of pressure. In the surface of the support member 10 is formed a recess 13a for disposing the air flow measuring element 20 therein. The recess 13a is formed by punching a desired number of constituent layers of the laminate substrate in a green sheet state into a desired shape with use of a punching die.

The air flow measuring element 20 is mounted within the recess 13*a* through an adhesive 30. A suitable depth of the recess 13*a* is determined so that the surface of the air flow measuring element 20 and that of the support member (laminate substrate) 10 become flush with each other, taking the thickness of the adhesive 30 also into account. This is because if there is a difference in height between the surface of the support member 10 and that of the air flow measuring element 20, the air flow is disturbed by such difference in height and the output characteristic becomes unstable. As the adhesive 30 there is used an epoxy or silicon adhesive.

Using the adhesive, a part of the back of the silicon substrate 28 is bonded to an inside bottom of the recess 13*a*. The non-bonded back portion of the silicon substrate 28 ensures a gap between it and the bottom of the recess 13*a*. Consequently, the heat insulating property of the substrate 10 against the heating resistor 22 is further enhanced by cooperation with the cavity 26. Also enhanced is the heat exchanging performance between the heat of the heating resistor 22 and the air flow.

Where required, a resistance film 14 necessary for an electronic circuit related to the measurement of air flow is formed on the surface or the back of the support member 10.

As the intake air temperature sensing element 1 is used a chip-like thermistor which permits the reduction of size. For example, the thermistor is formed to a size of 1.6×0.8×0.8 (mm) or 1.0×0.5×0.5 (mm) using such a material as $MnO$—$CoO$—$NiO$ spinel or $MnO$—$CoO$ spinel/$ZrO_2$ solid electrolyte/$Al_2O_3$-spinel composite. Using a chip mouner, such a chip-like intake air temperature sensing element 1 can be mounted onto the laminate substrate 10 in the same way as and simultaneously with the thermal air flow measuring element 20.

Figure 5:
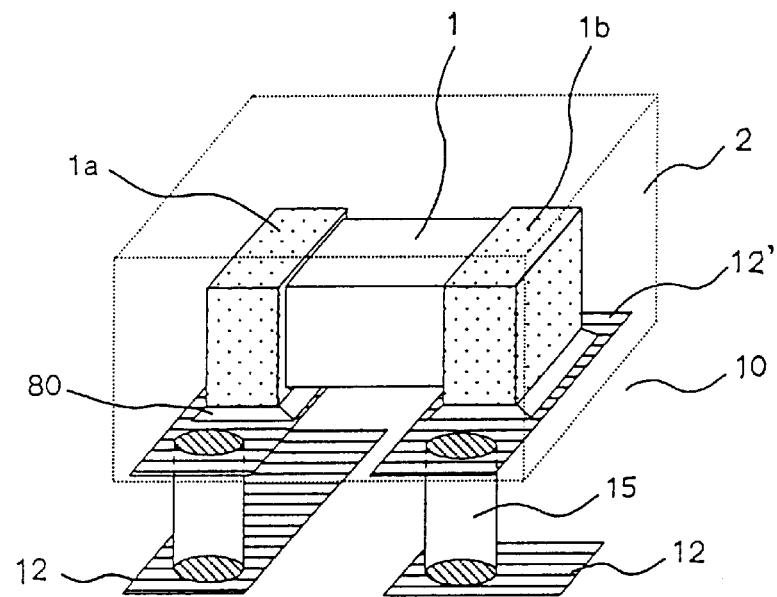
FIG. 5 is a perspective view showing a mounted state of the intake air temperature sensing element used in the first embodiment in a see-through manner.

As shown in FIG. 5, the intake air temperature sensing element 1 is provided at both ends thereof with electrodes 1*a* and 1*b*, which are each electrically connected through solder 80 to a conductor film (electric connection) 12' formed on the surface of the support member (laminate substrate) 10. As noted earlier, the conductor film 12' is connected to the inner conductor 12 in the support member 10 through a via hole 15. A pattern of the solder 80 can be formed, for example, by printing as is the case with other circuit components 17. Thus, the intake air temperature sensing element 1 can be electrically connected to the substrate without decreasing the productivity.

On one side of the support member 10, on the side cantilevered by the holder 40, there is formed an electronic circuit section 19 related to the measurement of air flow. The electronic circuit section 19 is composed of such components as an IC chip 18 and resistors 17 and is sealed within the holder 40.

The back of the support member 10 is fixed to an inner surface of the holder 40 through an adhesive 47 and its electronic circuit section 19 side is sealed with silicon gel or the like.

Figure 7:
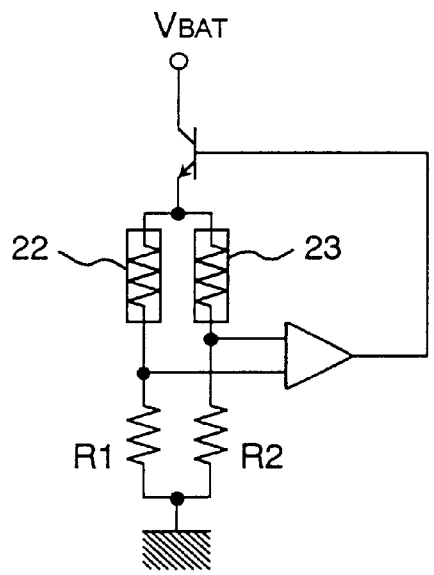
FIG. 7 is an electric circuit diagram of the air flow sensor of the first embodiment.

A circuit diagram related to the electronic circuit section 19 and the thermal air flow measuring element 20 is illustrated in FIG. 7. As shown in the same figure, outputs of a heating resistor 22 and a temperature sensing resistor 23 are taken out through resistors R1 and R2, and a feedback circuit is formed through an operational amplifier, whereby the heating resistor 22 is controlled so as to become higher by a predetermined certain temperature than the temperature sensing resistor 23.

Conductors 11 on the surface and the back of the support member (laminate substrate) 10 and inner conductors 12 are connected together through via holes 15. By thus forming a circuit for controlling the thermal air flow measuring element with use of the inner conductors 12 in the laminate substrate 10, the circuit can be fabricated in a compact shape and hence it is possible to make contribution to reducing the size of the air flow sensor.

Since the air flow measuring element 20 about 2×6×0.3 mm in size, as noted earlier, if it is disposed centrally of the sub-passage 41 as in FIG. 1, the electric connection 31*a* is exposed to the air in the absence of resin 2 and so is the electric connection 12' of the intake air temperature sensing element 1. It follows that the electric connection is placed in a metal corrosion inducing environment which contains moisture present in intake air, gasoline vapor, engine oil, and sulfurous acid gas present in blow-by gas. But in this embodiment there is adopted a structure wherein the electric connection is not directly exposed to intake air because it is sealed with resin. Consequently, it is possible to prevent the aforesaid corrosion.

Besides, since the portions sealed with resin 2 are formed on the support member 10 which is made of a glass-ceramic material having a low thermal conductivity and are spaced away from the holder 40 and the pipe wall of the sub-passage 41, the heat generated from the engine and also from the electronic circuit section of the air flow sensor can be prevented from being transmitted to the intake air temperature sensing element 1 and the air flow measuring element 20 through the resin.

If the resin 2 used for sealing should come into contact with a resin portion in the air flow sensor such as the holder 40, there may occur the following phenomenon. For example, in case of starting the engine of automobile after having been left standing in a severe district or in the case where an automobile is driven continuously in a high-temperature district, an environment temperature of the thermal air flow sensor varies in a wide range of −30 to 100° C. or higher. At this time, if heat of the above environment temperature is transferred to the intake air temperature sensing element through the housing of the air flow sensor, it becomes difficult for the sensing element to accurately measure the intake air temperature. Such an inconvenience can be prevented by adopting the foregoing structure in this embodiment.

If the air flow measuring element 20 is disposed centrally of the sub-passage 41 and the portion of the connecting wire 31*a* is sealed with resin 2 such as an epoxy resin, the surface of the air flow measuring element 20 becomes substantially flush with the surface of the support member 10 and the resin 20 covers the electric connection 31*a* and the vicinity thereof gently in a filmy form. Therefore, even if the electric connection is positioned near the wall surface of the sub-passage 41, it is possible to prevent the disturbance of intake air flow moving near the said wall surface, thus making it possible to keep the air flow measuring accuracy high.

For the sealing with resin 2 there may be adopted such a method as printing or potting. In the printing method, variations in shape among sealed portions are small as compared with the potting method. Since each sealed portion is exposed to the flow of air and is located near the airflow measuring element 20, the smaller the variations in shape, the smaller the variations in air flow measurement.

As noted earlier, due to the influence of a change in environment temperature of the engine, the air flow sensor 100 is placed in an environment where the temperature varies in the range of about −30 to 130° C. Therefore, in order that the intake air temperature Sensing element 1 installed in the air flow sensor 100 can detect the temperature of intake air accurately, it is desirable to minimize the influence of such temperature variation. To this end it is desirable that the support member 10, which is a heat conducting path to the intake air temperature sensing element 1, be formed using a material of a low thermal conductivity. The thermal conductivity of the glass-ceramic substrate 10 as the support member used in the invention is about 3 5 to 4 W/m·EK. In this connection, reference is made to the thermal conductivity of an ordinary ceramic substrate, which is about 21 W/m·EK, and that of stainless steel, which is about 15 W/m·EK. Thus, the structure of mounting the intake air temperature sensing element 1 onto the glass-ceramic substrate 10 is very effective.

Particularly in this embodiment, since the intake air temperature sensing element 1 is disposed on the glass-ceramic substrate (support member) 10 at a position distant from the holder 40, it is possible to minimize the quantity of heat transmitted from the air flow sensor to the intake air temperature sensing element 1.

It is necessary that the intake air temperature sensing element 1 be installed at a position where it does not disturb the flow of air on the surface of the air flow measuring element 20. To meet this requirement, it is desirable that the intake air temperature sensing element 1 be disposed at the front end, or the tip, of the support member 10 as in FIG. 1 (in other words, it is desirable to avoid overlapping of the intake air temperature sensing element 1 and the air flow measuring element 20 for the flow of air). Likewise, for preventing the intake air temperature sensing element 1 from being influenced by the heat of the air flow measuring element 20, it is desirable that the intake air temperature sensing element 1 be mounted upstream of the air flow measuring element 20.

In case of disposing the intake air temperature sensing element 1 at the front end portion of the support member 10, it is required that a wiring space between electrodes 16 located at the opposite-side end portion and the intake air temperature sensing element 1 be ensured without increasing the surface area of the support member 10. But this requirement can be satisfied by using the inner conductors 12 as in this embodiment, which conductors constitute a characteristic feature of the laminate substrate 10.

Further, since air flows at a velocity higher in the interior of the sub-passage 41 than in the main intake passage 42a, the cooling effect for the intake air temperature sensing element 1 is more outstanding. Thus, mounting the intake air temperature sensing element 1 on the support member 10 of the air flow sensor so as to be positioned in the sub-passage 41 is effective for enhancing the sensing accuracy of the intake air temperature sensing element 1.

As referred to previously, since the intake air temperature sensing element 1 and the surface conductors 12' can be sealed with resin 2, it is possible to improve their durability to a remarkable extent. Besides, since the use of the chip-like intake air temperature sensing element 1 permits forming the sealed area in a very small size, it is possible, despite the resin sealing, to attain a performance equal to that obtained without resin sealing.

Figure 6:
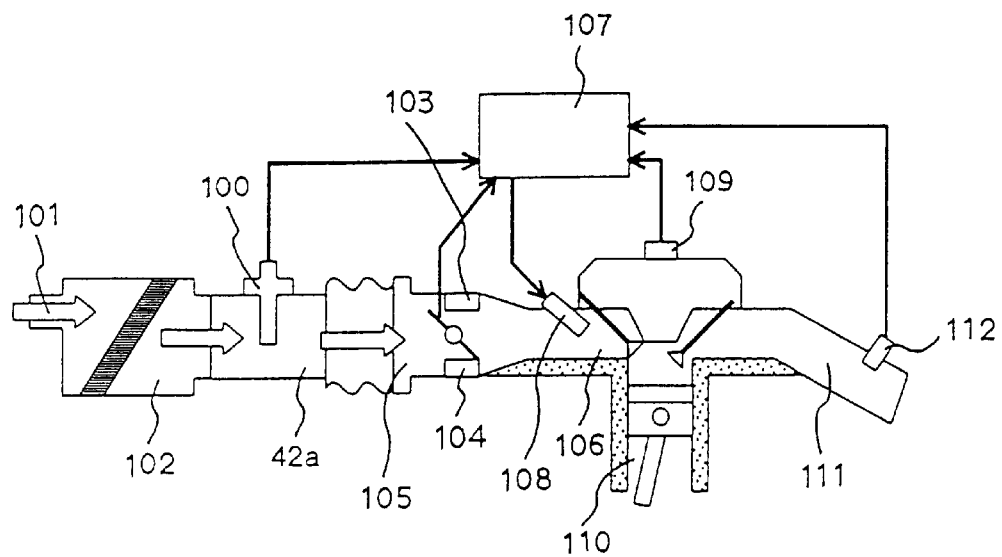
FIG. 6 is a schematic diagram of an engine system with the air flow sensor of the first embodiment mounted thereon.

FIG. 6 is a system diagram of an internal combustion engine such as a gasoline engine which uses the air flow sensor 100 of this embodiment.

As shown in the same figure, in the intake passage 42a of an engine there are mounted the air flow sensor 100, an air cleaner 102, a throttle angle sensor 103, an idling speed control valve 104, and a throttle body 105. The numeral 106 denotes an intake manifold.

Intake air 101 flowing through the intake passage 42a is measured for flow by the air flow sensor 100 in the sub-passage and the temperature thereof is detected by the intake air temperature sensing element 1. An air flow signal is received by a vehicular control unit 107 using voltage or frequency and so is an intake air temperature signal using voltage.

The air flow signal is used for controlling a combustion structure composed of an injector 108, a tachometer 109, an engine cylinder 110, an exhaust manifold 111, and an oxygen sensor 112, and for controlling a sub-system.

As to the intake air temperature signal, as noted earlier, it is used, for example, for controlling the ignition timing, controlling the boost pressure of a turbo-charger, limiter control for fuel injection volume in a rapid acceleration, and further for judging whether the catalyst used has reached its active temperature or not.

Also in the case of a diesel engine system, though not shown, its basic construction is almost the same as that of the gasoline system and therefore the thermal air flow sensor according to the present invention can be applied thereto.

The support member 10 may take any of various other forms than that described in the above embodiment. Structurally, such various other forms are common in many points to the one described in the above embodiment. Reference will be made below particularly to different points.

Figure 8:
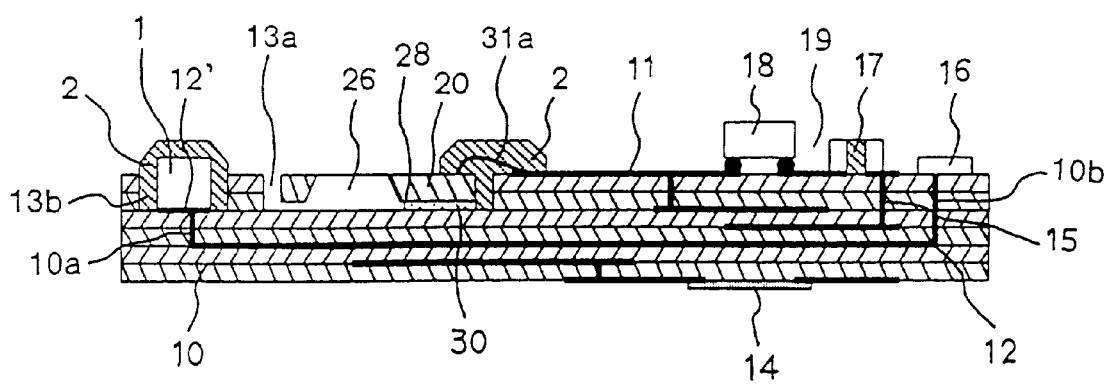
FIG. 8 is a longitudinal sectional view showing a state in which component elements of a thermal air flow sensor according to the second embodiment of the present invention have been mounted on a support member used in the second embodiment.

In the second embodiment illustrated in FIG. 8, a recess 13b is formed in the surface of the support member (laminate substrate) 10 in addition to the recess 13a which is for the air flow measuring element 20, and the intake air temperature sensing element 1 is mounted therein, whereby the height of the element 1 exposed to the surface of the laminate substrate 10 after sealing can be made low.

According to the above structure, the disturbance of air flow on the surface of the support member 10 is diminished, so that the disturbance of air flow on the surface of the air flow measuring element 20 is diminished and the flow measuring accuracy is improved.

Figure 9:
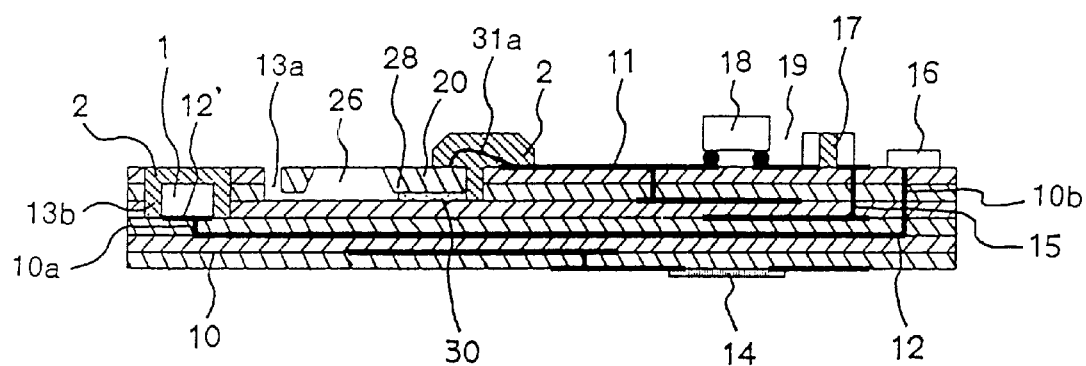
FIG. 9 is a longitudinal sectional view showing a state in which component elements of a thermal air flow sensor according to the third embodiment of the present invention have been mounted on a support member used in the third embodiment.

In the third embodiment illustrated in FIG. 9, like the embodiment illustrated in FIG. 8, the recess 13b for the intake air temperature measuring element 1 is formed in the surface of the support member 10, but the thickness of the intake air temperature sensing element 1 is set smaller than the depth of the recess 13b, whereby the surface of the intake air temperature sensing element 1 after resin sealing can be made substantially flush with the surface of the laminate substrate 10. This is most effective in diminishing the disturbance of air flow on the surface of the support member 10. The recess 13b can be formed simultaneously with formation of the recess 13a for the air flow measuring element 20 and thus can be formed without impairing the productivity.

As shown in FIGS. 8 and 9, at the time of mounting the intake air temperature sensing element 1 into the recess 13b there arises a difference in height from the soldered surface portions (surface conductors) which are for mounting other circuit components such as components 17 and 18, thus making it difficult to form a solder pattern of the intake air temperature sensing element 1 simultaneously with formation of solder patters of such circuit components 17 and 18. But this can be remedied by such a structure as illustrated in FIG. 10.

Figure 10:
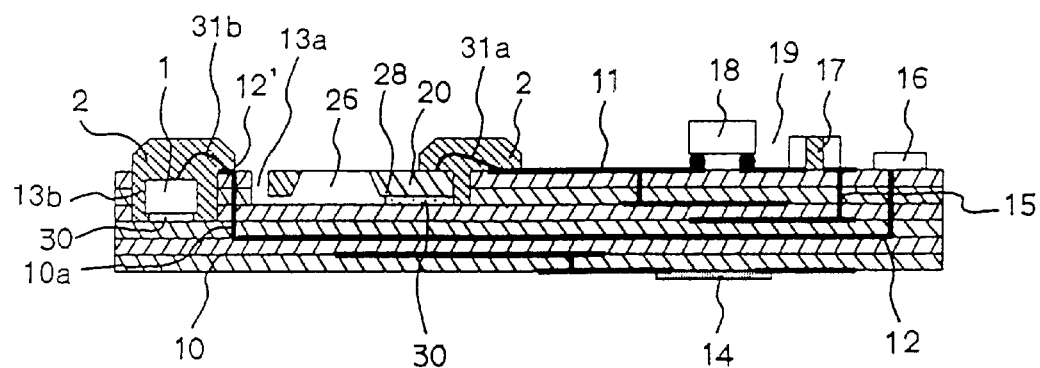
FIG. 10 is a longitudinal sectional view showing a state in which component elements of a thermal air flow sensor according to the fourth embodiment of the present invention have been mounted on a support member used in the fourth embodiment.

In the fourth embodiment illustrated in FIG. 10, one end 12' of an inner conductor 12 is exposed through a via hole 10a to the surface of the support member 10 around the recess 13b (the mounted position of the intake air temperature sensing element 1) formed in the support member. The exposed portion 12' is constituted by the conductor film formed on the surface of the support member and this conductor film 12' and the intake air temperature sensing element 1 are connected together by bonding of wire 31b such as a gold wire. The intake air temperature sensing element 1 is secured to the bottom of the recess 13b through the adhesive 30.

By so doing, the foregoing problem related to the formation of a solder pattern can be solved; besides, the bonding work for the intake air temperature sensing element 1 can be done simultaneously with the bonding work for the air flow measuring element 20 and the laminate substrate surface conductor 11. Consequently, the intake air temperature sensing element 1 can be connected electrically without impairing the productivity.

In the case where the surface of the intake air temperature sensing element 1 is flush with or lower than the surface of the air flow measuring element 20, the height of the connecting wire 31b from the intake air temperature sensing element 1 can be set equal to or lower than the height of the connecting wire 31a from the air flow measuring element 20. Consequently, the height of the sealing resin 2 for the intake air temperature sensing element 1 and that for the air flow measuring element 20 can be made equal to each other.

In this case, the electric connections 31a and 31b of the air flow measuring element 20 and the intake air temperature sensing element 1, respectively, can be resin-sealed simultaneously by the foregoing printing method, so that, as mentioned previously, variations in sealed shape are diminished and the thermal air flow sensor 100 can be produced with a high accuracy.

Figure 11:
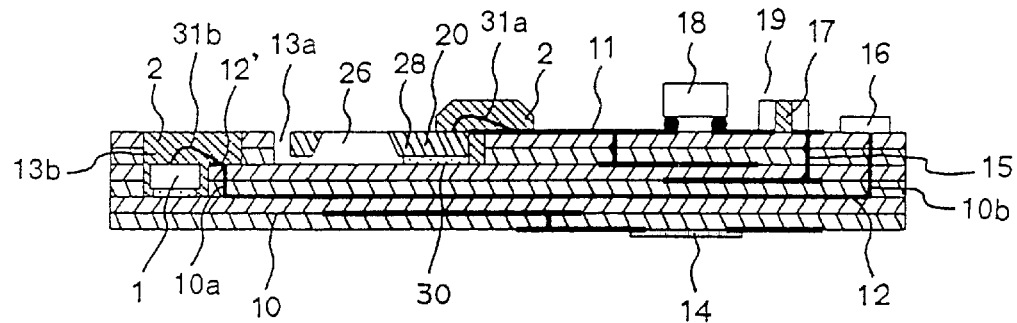
FIG. 11 is a longitudinal sectional view showing a state in which component elements of a thermal air flow sensor according to the fifth embodiment of the present invention have been mounted on a support member used in the fifth embodiment.

Also in the fifth embodiment illustrated in FIG. 11, the intake air temperature sensing element 1 and each surface conductor 12' formed on the support member 10 are connected together by wire bonding 31b, provided stepped surfaces are formed so that the surface of the surface conductor 12' becomes lower than the top surface of the support member 10. By so doing, it becomes possible to position the wire bonding 31b within the recess 13b, and the surface of the resin 2 which seals the wire bonding portion (electric connection) can be made substantially flush with the surface of the laminate substrate 10.

A suitable example of the sealing resin 2 is one superior in environmental resistance and in swelling resistance against non-polar solvents such as gasoline and engine oil. Examples include fluorine-containing resins in addition to the epoxy resins referred to earlier. Particularly, fluorine-containing resins are softer than epoxy resins even after curing and are therefore advantageous in that stresses imposed on the connecting wires 31a and 31b are smaller. However, in point of handleability after resin sealing, fluorine-containing resins are inferior to epoxy resins.

By using the chip-like intake air temperature sensing element 1 which permits mounting in a reduced size, the sensing element 1 can be mounted to the support member 10 with scarcely any necessity of introducing new manufacturing equipment. Thus, it becomes possible to produce an air flow sensor equipped with a highly reliable intake air temperature sensing element. Particularly, in the construction shown in FIG. 10, the air flow measuring element 20 and the intake air temperature sensing element 1 can be assembled by similar assembling processes, thus making it possible to improve the productivity.

Figure 12:
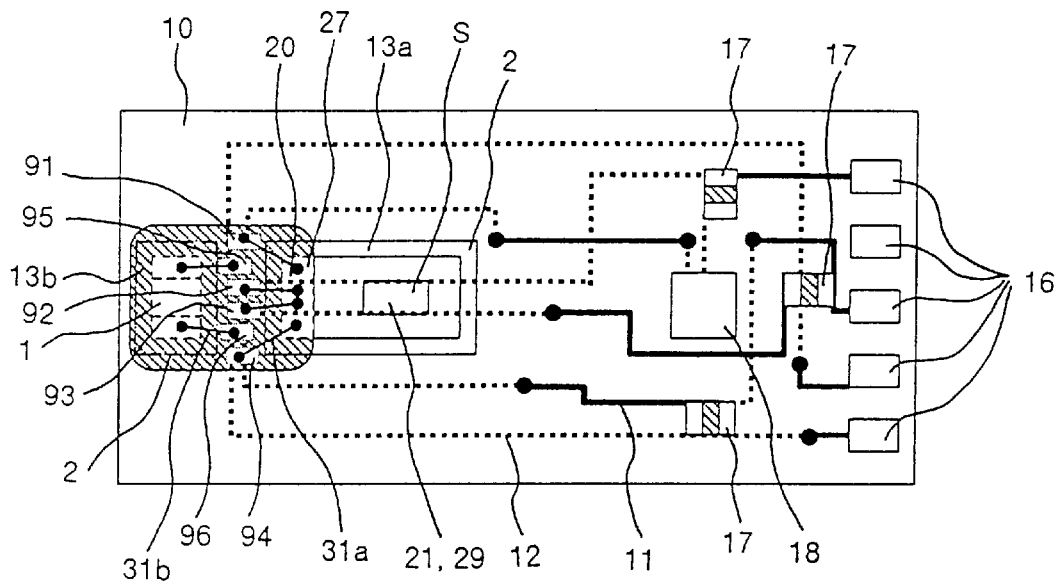
FIG. 12 is a plan view showing a state in which component elements of a thermal air flow sensor according to the sixth embodiment of the present invention have been mounted on a support member used in the sixth embodiment.
Figure 13:
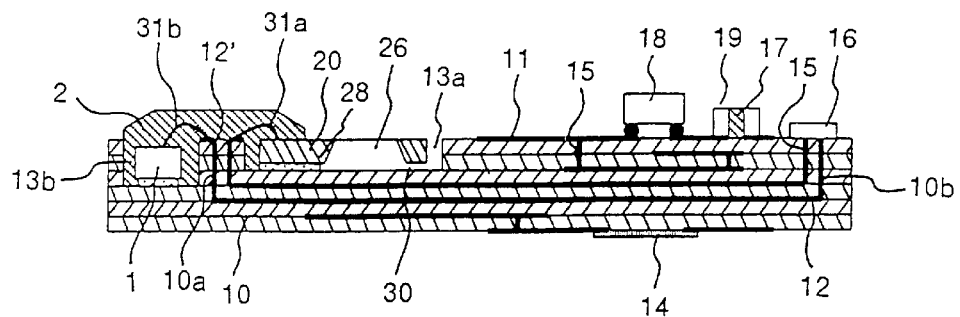
FIG. 13 is a longitudinal sectional view of the sixth embodiment.

FIG. 12 is a plan view of a support member 10 used in the sixth embodiment of the present invention, as well as an air flow measuring and intake air temperature sensing components, and FIG. 13 is a longitudinal sectional view thereof.

Also in this embodiment, the intake air temperature sensing element 1 and the air flow measuring element 20 are mounted in the recesses 13b and 13a, respectively. The mode of electric connection between the intake air temperature sensing element 1 and each conductor 12' on the support member 10 is the same as in the embodiment illustrated in FIG. 10.

In this embodiment, moreover, electric connections 31b and 31a of the intake air temperature sensing element 1 and the air flow measuring element 20, respectively, arranged on the support member 10 so as to gather in one place and are together sealed with resin 2.

According to the above structure, the recesses 13a and 13b are formed so as to be arranged in a direction perpendicular to the air flowing direction, and electrodes 91 to 96 for electric connection of the elements 1 and 20 are provided between the recesses 13a and 13b in the surface of the support member 10. Further, the air flow measuring element 20 is disposed in a direction opposite to its direction adopted in the previous embodiments, i.e., it is disposed so that its electrodes 27 face the intake air temperature sensing element 1). According to this arrangement it suffices to set only one place for sealing with resin 2, thus making it possible to further improve the productivity of the air flow sensor.

For measuring the intake air temperature accurately it is desirable to minimize the influence of heat of the engine and the air flow sensor circuit section 19 upon the intake air temperature sensing element 1 through the support member 10.

As the material of the support member 10, the glass-ceramic material itself used in the previous embodiments can fully eliminate the thermal influence of the engine and the air flow sensor circuit section (including the air flow measuring element 20) upon the intake air temperature sensing element 1, but by taking various heat conduction suppressing measures as will be shown in the following embodiments it is made possible to ensure a high accuracy of the intake air temperature sensing element 1. Although in the following embodiments there is used a ceramic material higher in thermal conductivity than the glass-ceramic material, it is possible to eliminate the aforesaid thermal influence to a satisfactory extent.

Figure 14:
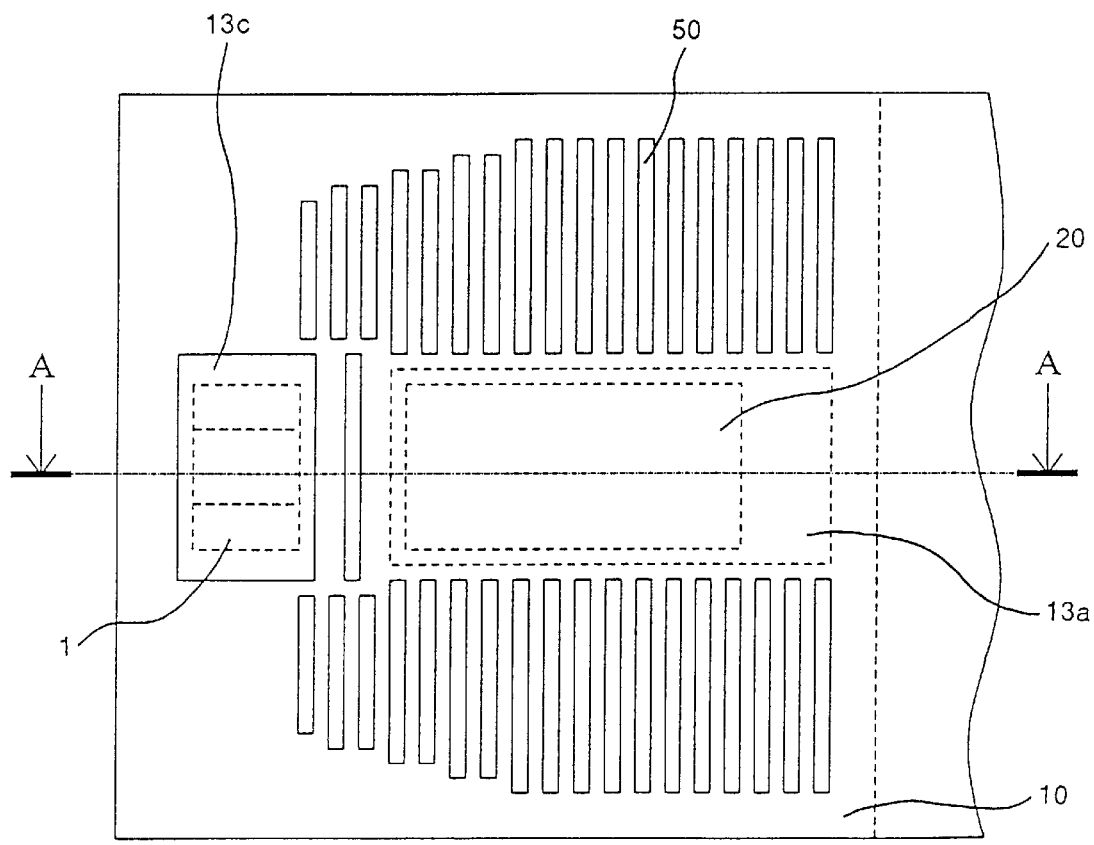
FIG. 14 is a partially omitted plan view showing a state in which component elements of a thermal air flow sensor according to the seventh embodiment of the present invention have been mounted on a support member used in the seventh embodiment, as seen from the back of the substrate.
Figure 15:
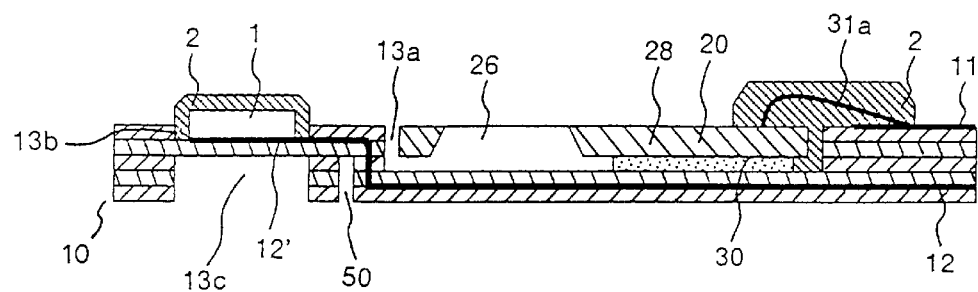
FIG. 15 is a sectional view taken on line A—A in FIG. 14.

FIG. 14 is a partially omitted plan view showing the back of a support member 10 used in the seventh embodiment of the present invention and FIG. 15 is a longitudinal sectional view taken on line A—A in FIG. 14.

In this embodiment, a large number of slits 50 are formed in the back of the support member 10 to suppress the conduction of heat from the air flow sensor and the engine to the intake air temperature sensing element 1 through the support member 10. As a result, it is possible to improve the accuracy of the intake air temperature sensing element 1.

It is preferable that the surface of the support member 10 be free of any concave or convex which would disturb the air flow and that therefore the slits 50 be formed on the back side of the support member 10. Likewise, by forming a recess 13c in the support member 10 in a position corresponding the underside of the intake air temperature sensing element 1, it is possible to diminish the influence of the thermal conduction. The slits 50 and the recess 13c can be formed by the same method as the. method of forming the recess 13a which is for mounting the thermal air flow measuring element 20 therein, and thus can be formed without impairing the productivity.

Figure 16:
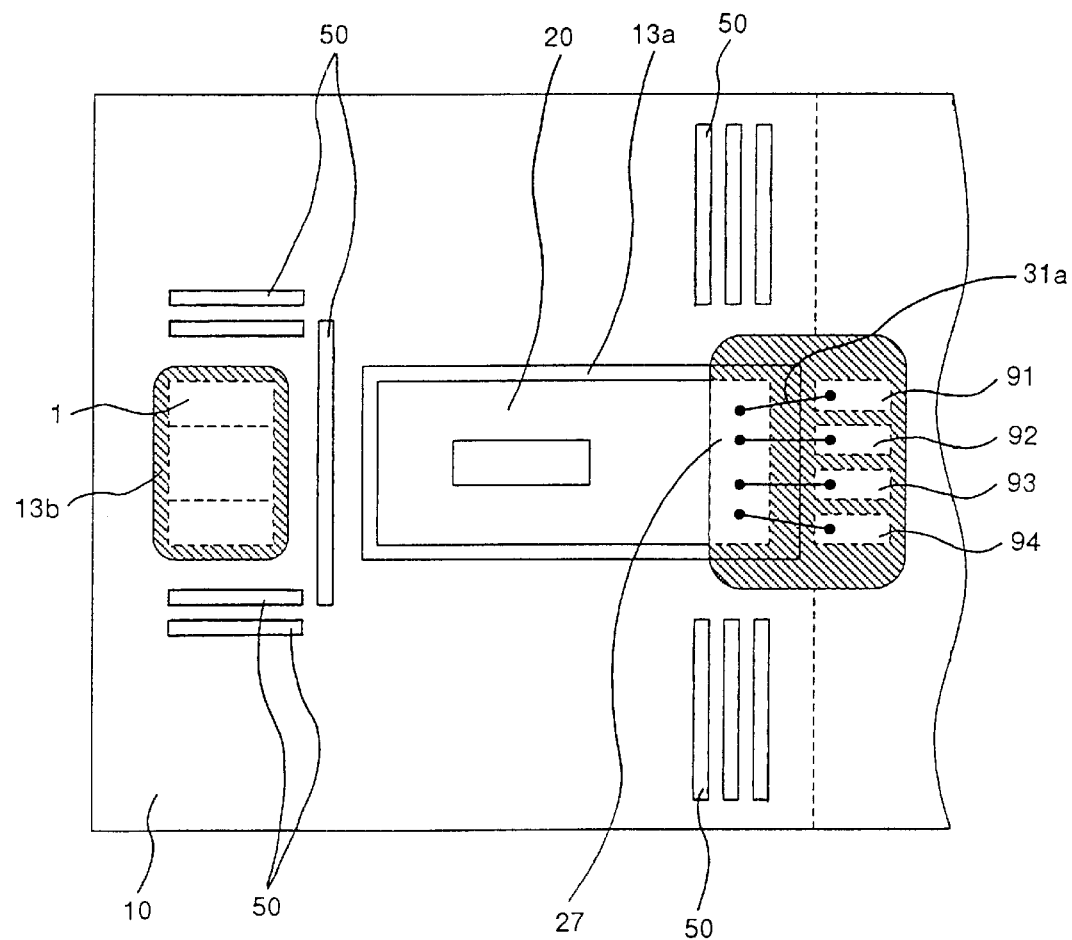
FIG. 16 is a partially omitted plan view showing a state in which component elements of a thermal air flow sensor according to the eighth embodiment of the present invention have been mounted on a support member used in. the eighth embodiment.

The slits 50 may be formed on the surface side of the support member 10 insofar as the position where they are formed does not disturb the air flow on the surface of the air flow measuring element 20. In a support member 10 used in the eighth embodiment illustrated in FIG. 16, slits 50 are formed in the surface of the support member 10. The slits are formed around the intake air temperature sensing element 1 and on the support member cantilevered side with respect to the air flow measuring element 20. For obtaining a more outstanding heat conduction preventing effect it is preferable that the slits 50 be formed as through slits from the surface to the back of the support member 10.

Figure 17:
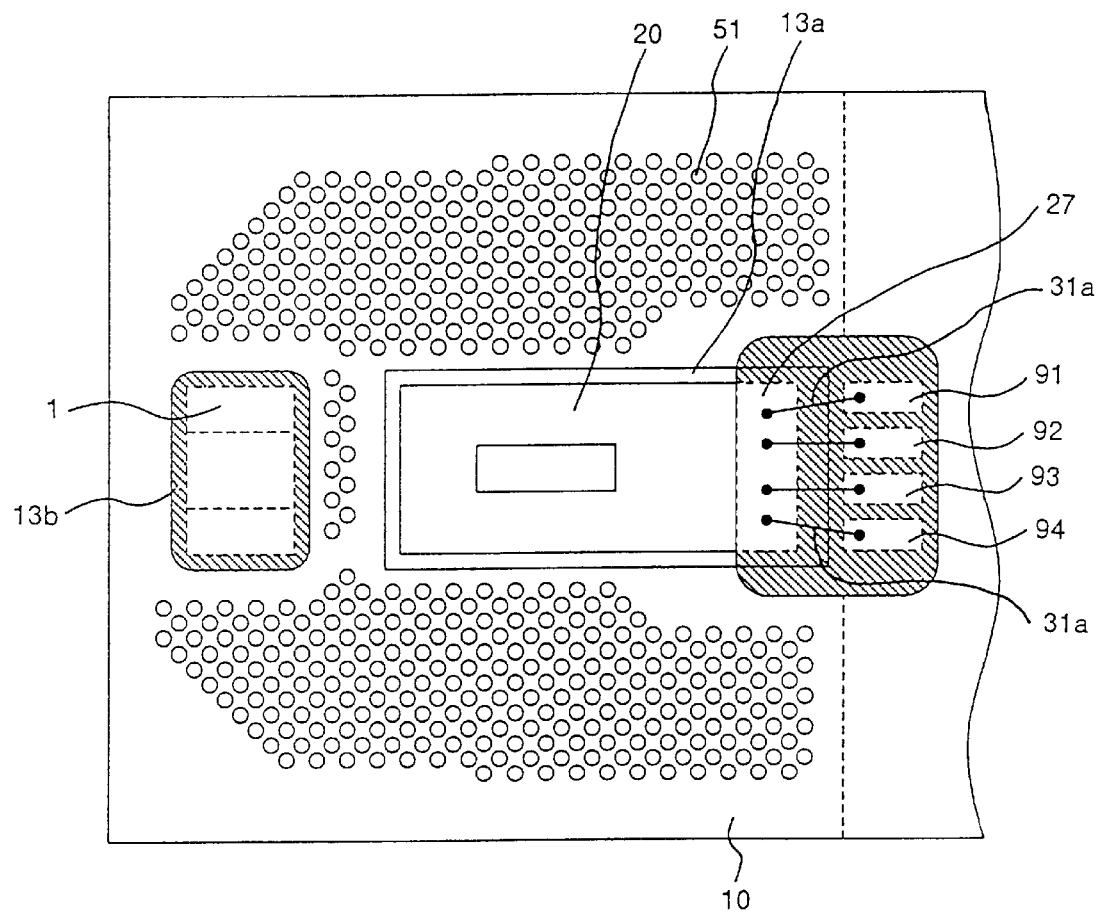
FIG. 17 is a partially omitted plan view showing a state in which component elements of a thermal air flow sensor according to the ninth embodiment of the present invention have been mounted on a support member used in the ninth embodiment.

The same heat conduction preventing effect as above can be obtained even by forming a large number of through holes 51 in the surface of the support member 10 as in FIG. 17 which illustrates the ninth embodiment of the present invention. The through holes 51 can be formed simultaneously with formation of via holes 15 in the laminate substrate 10 as referred to previously. In the case of a thermal air flow measuring element 20 shown in FIG. 17, the stain resistance can be improved by forming the through holes 51. This is for the following reason.

Figure 18:
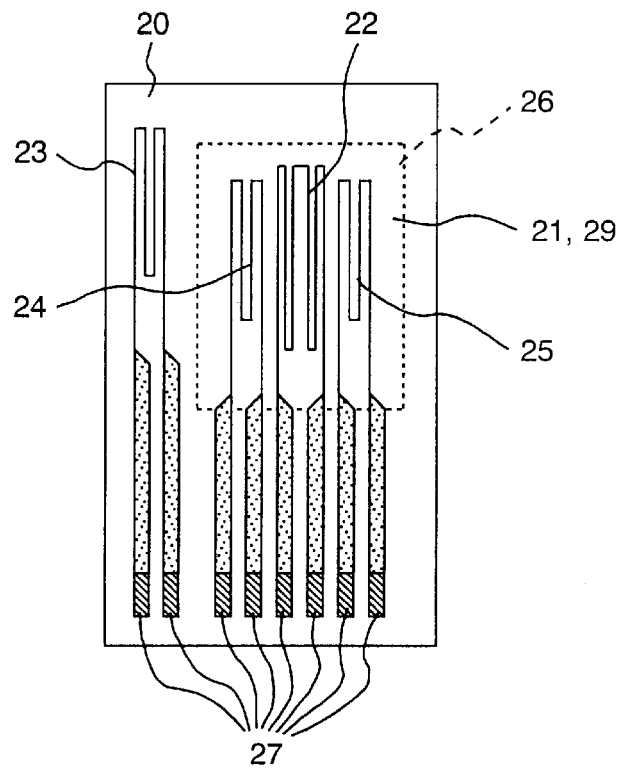
FIG. 18 is a plan view of an air flow measuring element used in the ninth embodiment.
Figure 19:
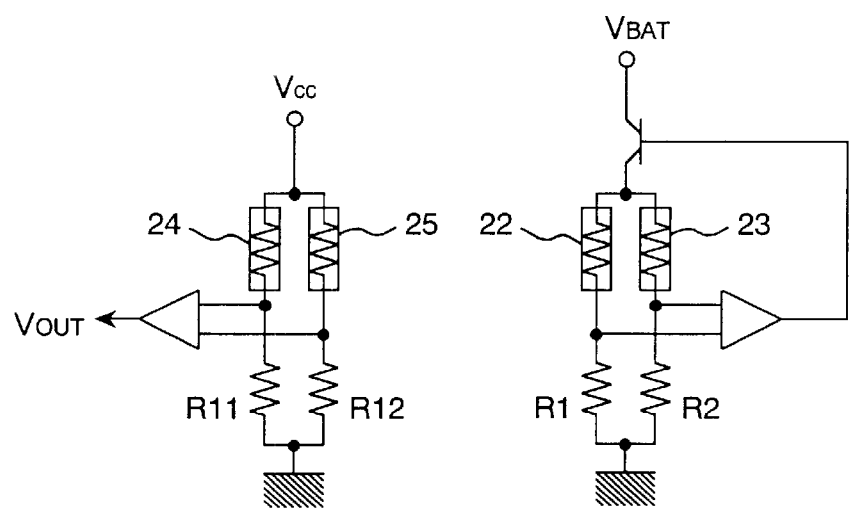
FIG. 19 is an electric circuit diagram of the air flow sensor of the ninth embodiment.

A description will be given first about the thermal air flow measuring element 20 with reference to FIG. 18. In this embodiment, a heating resistor 22 and a temperature sensing resistor 23 for temperature compensation constitute a feedback circuit, as shown in FIG. 19. The configuration of this circuit is the same as that shown in FIG. 7 to which reference has been made already. The heating resistor 22 is controlled so as to be higher in temperature to a certain degree relative to the temperature sensing resistor 23.

In this embodiment, moreover, temperature sensing resistors 24 and 25 are disposed on both sides of the heating resistor 22 so as to be positioned respectively upstream and downstream of the heating resistor. The temperature sensing resistors 24 and 25 receive heat from the heating resistor 22 and each reach a certain temperature level. In the absence of air flow, both upstream and downstream temperature sensing resistors 24, 25 are at approximately the same temperature. This state is represented by a broken-line temperature distribution in FIG. 20. On the other hand, in the presence of air flow, the temperature sensing resistor 24 located on the upstream side is cooled by the air flow and the temperature sensing resistor located on the downstream side becomes easier to receive heat from the upstream side. This state is represented by a solid-line temperature distribution in FIG. 20, in which there arises a temperature difference between the upstream- and downstream-side temperature sensing resistors 24, 25. Since this temperature difference serves as a function of air flow, the air flow can be detected by detecting the amount of such temperature difference. More specifically, in this embodiment the upstream- and downstream-side temperature sensing resistance values vary depending on the above temperature difference, so by constituting such a bridge circuit as shown in FIG. 19 the temperature difference can be converted to a voltage difference to determine the flow of air.

Figure 20:
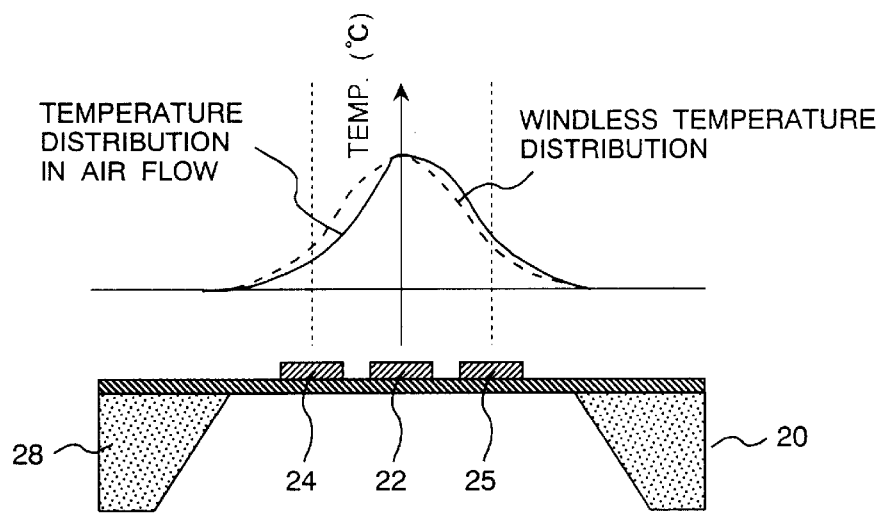
FIG. 20 is an explanatory diagram showing a temperature distribution on the air flow measuring element used in the ninth embodiment.

In this connection, since the thermal air flow measuring element 20 is of a structure wherein it is exposed to intake air, as noted earlier, a contaminant contained in the air flow is deposited on the surface of the thermal air flow measuring element 20 as a result of use over a long period. Consequently, the output characteristic of the air flow sensor 100 changes, and in the case of the thermal air flow measuring element shown in FIG. 18, a negative shift of the characteristic occurs in a high flow region, as shown in FIG. 20.

This is presumed to be because the amount of heat transmitted from the heating resistor 22 to the temperature sensing resistors 24 and 25 increases due to the deposition of contaminant and the amount of heat transmitted from the temperature sensing resistors 24 and 25 to air decreases, thus making the occurrence of a temperature difference difficult.

Figure 21:
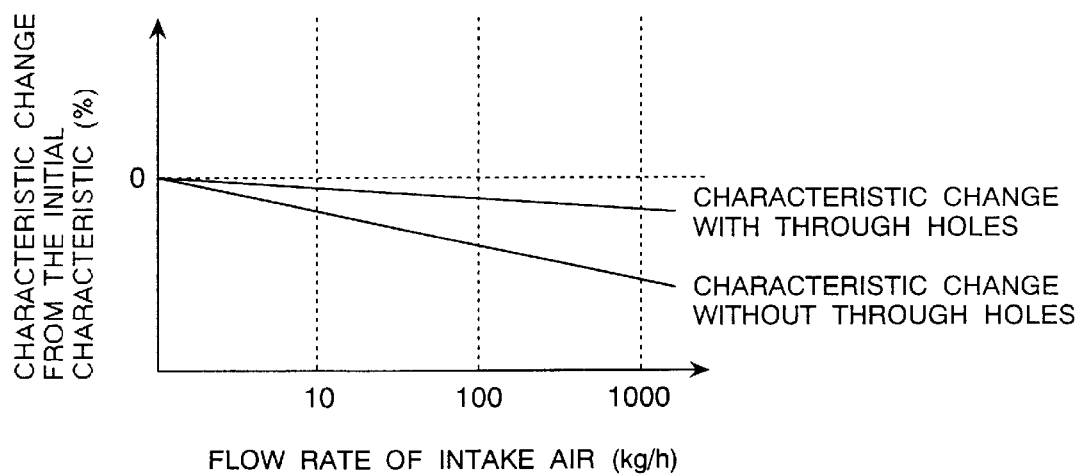
FIG. 21 is a diagram showing changes in output characteristics with time of the air flow measuring element used in the ninth embodiment which is formed with through holes and an air flow measuring element free of through holes.
Figure 22:
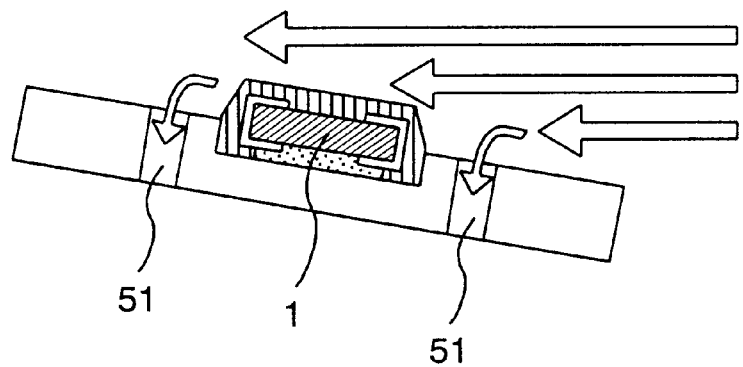
FIG. 22 is an explanatory diagram showing the state of air flowing over the support member before the adhesion thereto of contaminant in the ninth embodiment.
Figure 23:
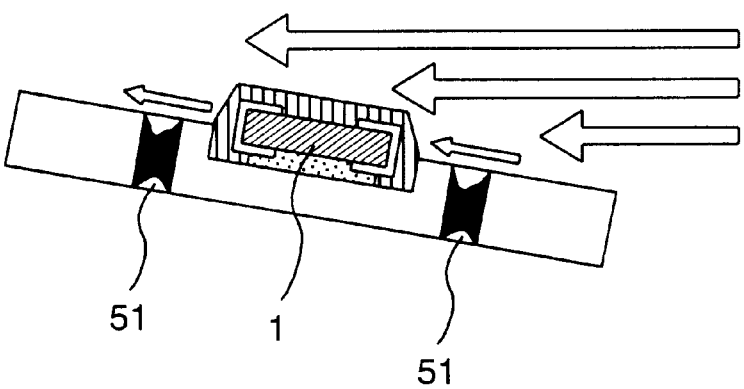
FIG. 23 is an explanatory diagram showing the state of air flowing over the support member after the adhesion thereto of contaminant.
Figure 24A:
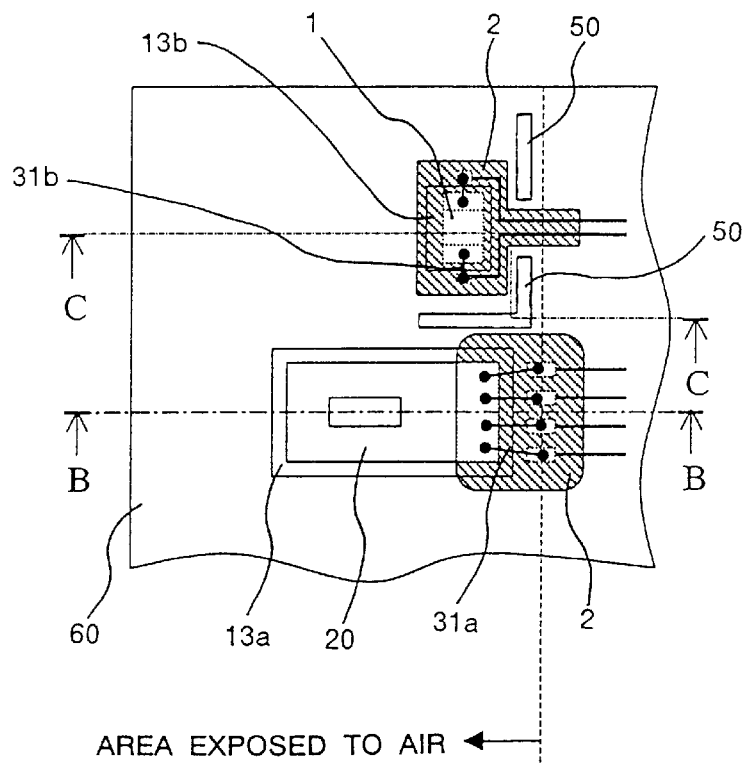
FIG. 24($a$) is a partially omitted plan view showing a state in which component elements of a thermal air flow sensor according to the tenth embodiment of the present invention have been mounted on a support member used in the tenth embodiment, FIG. 24($b$) is a sectional view taken on line B—B thereof, and FIG. 24($c$) is a sectional view taken on line C—C thereof.
Figure 24B:
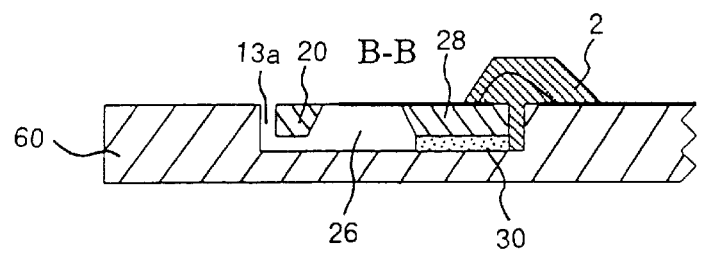
Figure 24C:
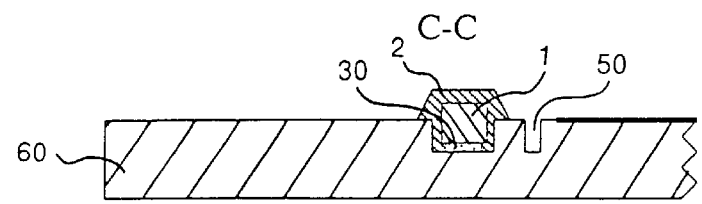

If the through holes 51 are formed, air flows also in the through holes as in FIG. 22 in the absence of no deposited contaminant, while in the presence of deposited contaminant the through holes 51 are filled up with the contaminant as in FIG. 23, so that the air flow on the substrate surface substantially increases. Thus, even with contaminant deposited on the air flow measuring element 20, the flow output characteristic of the air flow sensor is improved, as shown in FIG. 21.

Although in each of the above embodiments the support member 10 is constituted by a laminate substrate of a low thermal conductivity such as a glass-ceramic substrate, it is not always required to be a laminate substrate insofar as it is of a structure which prevents the conduction of heat from the holder (air flow sensor housing) 40 to the intake air temperature sensing element 1.

FIG. 14 illustrates an embodiment wherein a support member 60 constituted by a single-layer substrate is used in place of the support member (laminate substrate) 10, in which (a) is a partially omitted plan view of the support member 60 as seen from above, (b) is a sectional view taken on line B—B thereof, and (c) is a sectional view taken on line c—c thereof.

The support member 60 is also constituted using a glass-ceramic material for example.

In this case, the recess 13*a* for mounting the air flow measuring element 20, the recess 13*b* for mounting the intake air temperature sensing element 1, as well as the foregoing slits 50 and recess 13*c*, can be formed using a mold.

If the material of the support member 60 is of a low thermal conductivity such as a glass-ceramic material, then by combination with heat conduction suppressing slits 50 and recess 13*c*, it becomes possible to produce a thermal air flow sensor with an intake air temperature sensing element of a high performance even if the intake air temperature sensing element 1 is disposed on the cantilevered side of the support member 60.

Figure 25A:
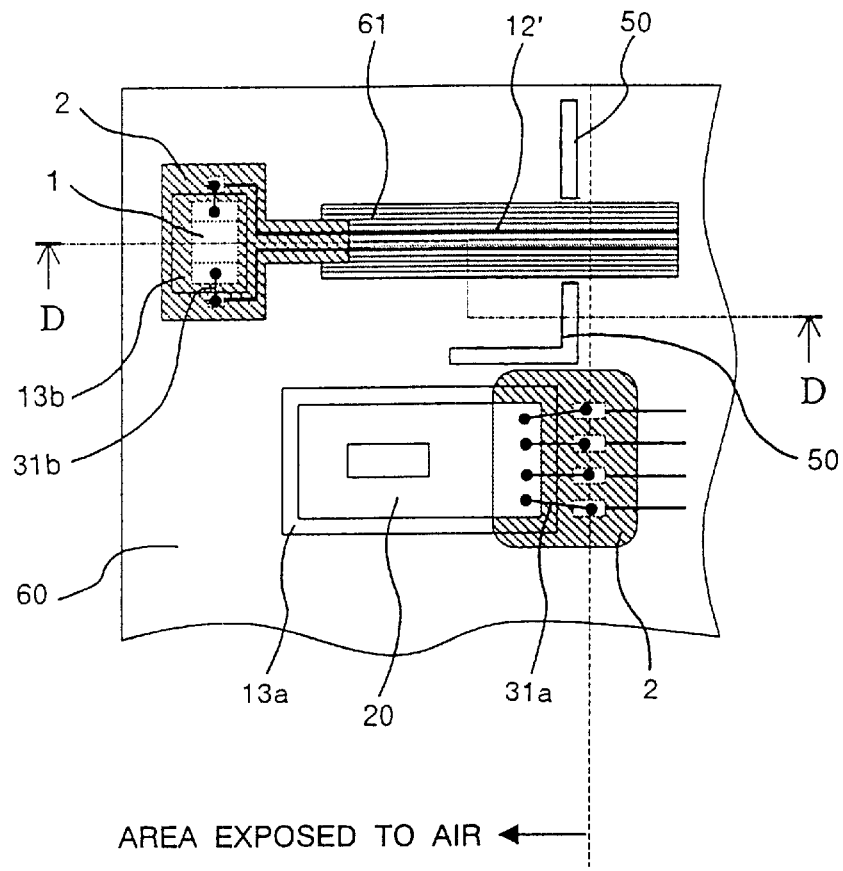
FIG. 25($a$) is a partially omitted plan view showing a state in which component elements of a thermal air flow sensor according to the eleventh embodiment of the present invention have been mounted on a support member used in the eleventh embodiment, and FIG. 25($b$) is a sectional view taken on line D—D thereof.
Figure 25B:
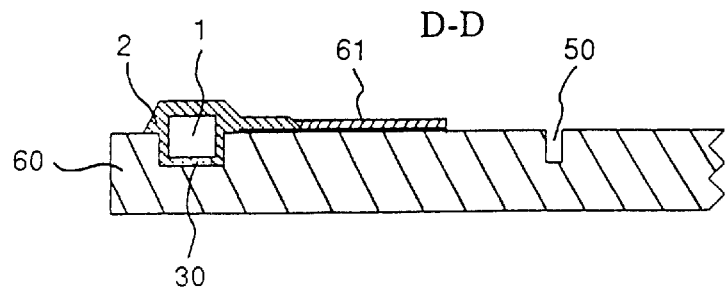

FIG. 25 illustrates the eleventh embodiment of the present invention, in which (a) is a partially omitted plan view of a support member 60 as seen from above and (b) is a sectional view taken on line D—D thereof.

The support member 60 used in this embodiment is also constituted by a single-layer substrate of a glass-ceramic material. As to the intake air temperature sensing element 1, it is disposed at a front end of the support member 60. Lead wires (conductors) 12' of the intake air temperature sensing element 1 are formed on the surface of the support member 60, but by covering the conductors 12' with glass it is made possible to enhance the corrosion resistance of the conductors, and by so doing it becomes possible to dispose the intake air temperature sensing element 1 at any position on the support member 60.

Figure 26:
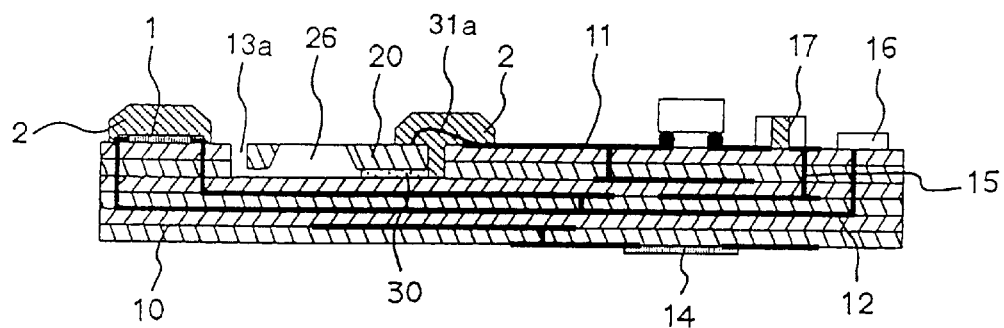
FIG. 26 is a partially omitted plan view showing a state in which component elements of a thermal air flow meter according to the twelfth embodiment of the present invention have been mounted on a support member used in the twelfth embodiment.

Although in each of the above embodiments a chip-like thermistor is used as the intake air temperature sensing element 1, the sensing element 1 may be constituted by a printed resistor on the support member 10 as in the embodiment illustrated in FIG. 26. In case of the sensing element 1 being constituted by such a printed resistor, its electric connection may be sealed with glass instead of resin 2.

Figure 27:
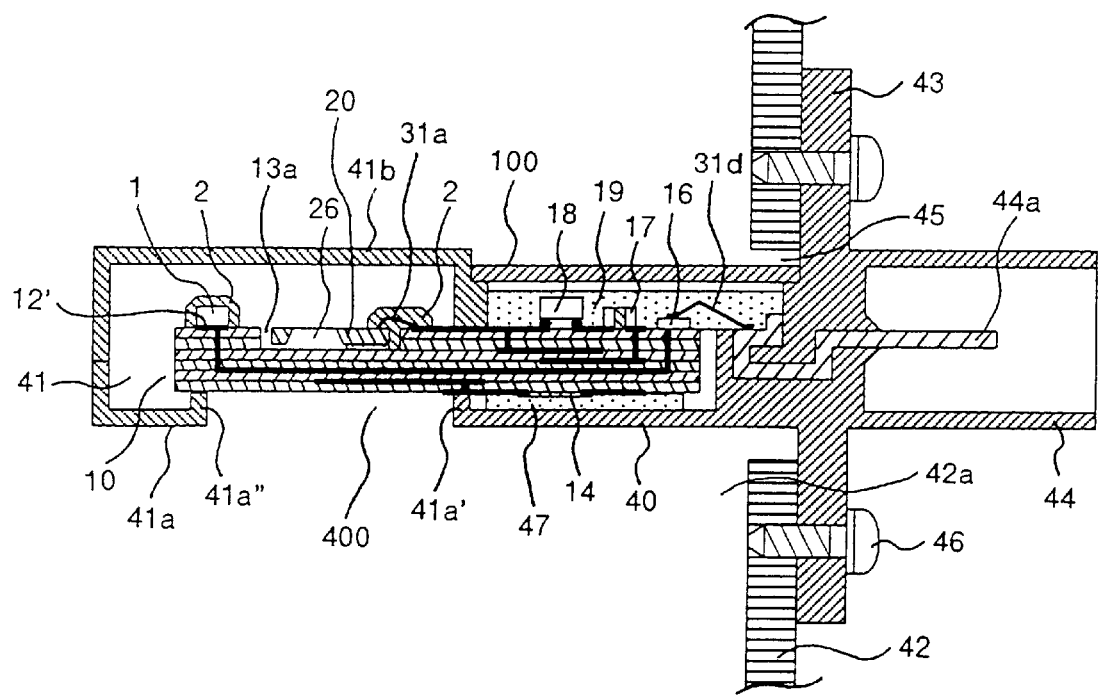
FIG. 27 is a longitudinal sectional view illustrating the third embodiment of the present invention.

FIG. 27 is a longitudinal sectional view illustrating the thirteenth embodiment of the present invention. One different point of this embodiment from the above previous embodiments resides in that the support member 10 (or the support member 60) is supported at both ends thereof by both holder 40 and the wall 41a of the sub-passage 41 instead of being cantilevered by the holder 40. Another different point resides in that there is adopted a structure whereby both sides of a portion of the support member 10 located away from the intake pipe wall 42 are easy to be taken away their heat by the air flow moving through the intake pipe and that the air flow measuring element 20 and the intake air temperature sensing element 1 are disposed on such a heat-removed surface of the support member.

In this embodiment, an opening 400 is formed in the wall 41a of the sub-passage and projections 41a' and 41a" for supporting both ends of the support member 10 are formed at the edge of the opening 400. On the side opposite to the side where the air flow measuring element 20 and the intake air temperature sensing element 1 are disposed the support member 10 faces the interior of the intake passage 42a through the opening 400. According to this embodiment, on the mounted side of the air flow measuring element 20 and the intake air temperature sensing element 1 the support member 10 is taken away its heat by the air flow moving through the sub-passage 41, while on the opposite side the heat of the support member is taken away by the air flow moving within the intake passage 42a through the opening 400.

As result, despite the structure wherein the support member 10 is supported by both ends thereof by the holder and the support passage wall, a satisfactory air-cooling effect for the support member 10 can be expected and the heat of the engine from the intake pipe wall and the heat of the heating resistor can be prevented from being transmitted to the intake air temperature sensing element 1.

Figure 28:
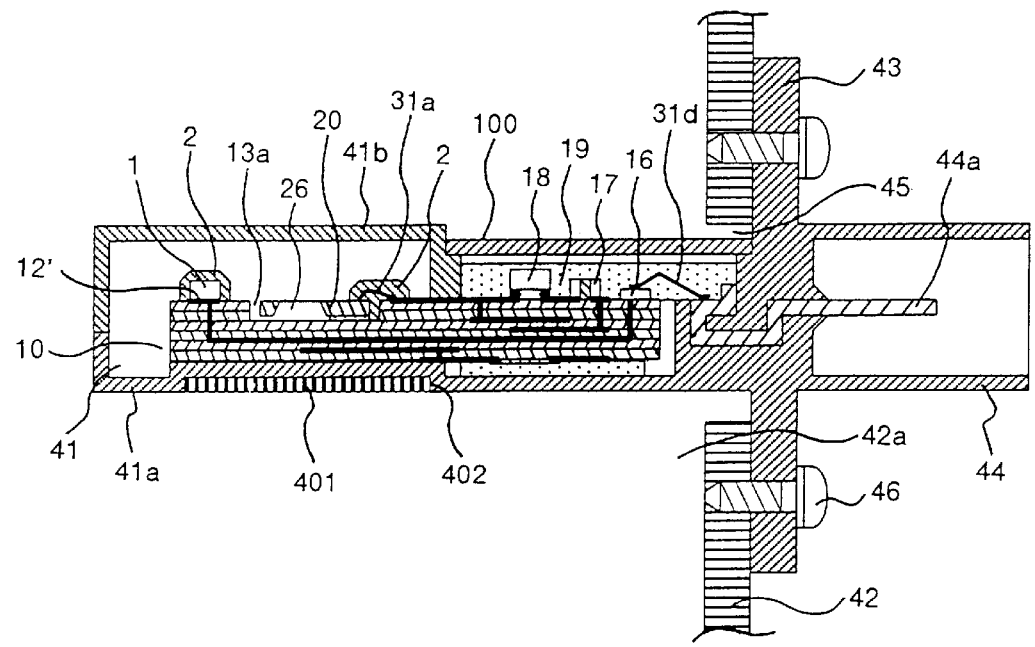
FIG. 28 is a longitudinal sectional view illustrating the fourteenth embodiment of the present invention.

FIG. 28 is a longitudinal sectional view illustrating the fourth embodiment of the present invention. This embodiment is different from the previous embodiments in that, as to the portion of the support member 10 positioned in the sub-passage 41, one side (opposite to the mounted side of the intake air temperature sensing element 1 and the air flow measuring element 20) is borne by an inner surface of the sub-passage wall 41a and that a heat radiating member such as a heat radiating plate (fins) 401 is formed on an outer surface of the sub-passage wall 41a whose inner surface bears the one side of the support member 10.

Also according to this construction, on the side where the air flow measuring element 20 and the intake air temperature sensing element 1 are mounted, the heat of the support member 10 is taken away by the air flow moving through the sub-passage 41, while on the opposite side the heat of the support member is taken away by the air flow moving through the intake passage 42a through the heat radiating fins 401. Thus, the same effect as in the thirteenth embodiment can be attained.

The outer surface of the wall 41a with the heat radiating fins 401 provided thereon is recessed inwards at 402 and the heat radiating fins 401 are fitted in the recess 402. In this way the heat radiating fins 401 are prevented from obstructing the air flow in the intake passage 42a.

Figure 29:
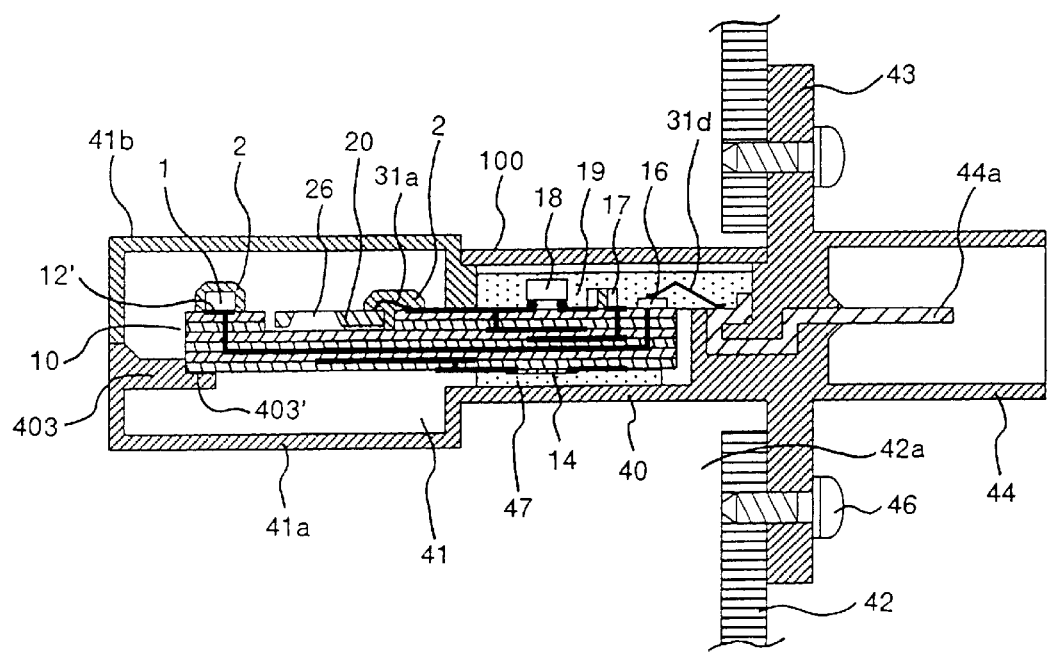
FIG. 29 is a longitudinal sectional view showing the fifteenth embodiment of the present invention.

FIG. 29 is a longitudinal sectional view illustrating the fifteenth embodiment of the present invention.

This embodiment also adopts both-end supporting structure for the support member 10, provided according to this embodiment both sides of the support member positioned in the sub-passage 41 are easy to be taken away their heat by the air flow moving through the intake pipe (sub-passage) as is the case with the embodiment illustrated in FIG. 1. One end of the support member is held by the holder 40, while the opposite end thereof is held by a projection 403 formed at one end of the sub-passage wall 41a. A portion 403' of the projection 403 which receives the front end of the support member 10 is stepped so that the stepped portion 403' can receive the support member and effect positioning thereof at the time of mounting of the support member.

Also in this embodiment an air-cooling effect for the support member 10 can be expected and the heat of the engine from the intake pipe wall and the heat of the heating resistor can be effectively prevented from being transmitted to the intake air temperature sensing element 1.

Although the intake air temperature sensing element 1 used in each of the above embodiments is one applied to an intake air temperature sensor which is to be used for a purpose different from the air flow measurement, the temperature measuring resistor 23 for temperature compensation may be disposed on the support 10 or 60 by the same method.

The support 10 or 60 can also be constituted by a resin substrate and the present invention is applicable also to a single-layer or laminate substrate of a resin such as a glass-epoxy, phenolic, or polyimide resin.

Industrial Applicability

According to the present invention, the influence of heat from the thermal air flow sensor and from the engine upon the intake air temperature sensor (intake air temperature sensing element) can be suppressed to a satisfactory extent, thereby making it possible to unite the intake air temperature sensor and the thermal air flow sensor with each other. Consequently, it is possible to provide an air flow sensor capable of reducing the number of components and cost of the measurement system, capable of rationalizing the mounting work and mounting space and further capable of keeping high the accuracy of the intake air temperature sensor.

Besides, the intake air temperature sensing element can exhibit corrosion resistance and retain its soundness even when placed in metal corrosion inducing environment containing moisture present in intake air, gasoline vapor, engine oil, sulfurous acid gas present in blow-by gas, and nitrogen oxides.

What is claimed is:

1. A thermal air flow sensor having a thermal element for measuring the air flow flowing through an intake passage, the thermal air flow measuring element having a heating resistor and being disposed within the intake passage, wherein an intake air temperature sensing element for sensing air temperature in the intake passage is configured to be used for other than air flow measurement and is mounted on a single support member together with said thermal air flow measuring element and is positioned within the intake passage, and wherein said air flow measuring element and said intake air temperature sensing element are electrically connected respectively to conductors disposed on said support member, and the resulting electric connections are sealed with resin.

2. A thermal air flow sensor according to claim 1, wherein:
said air flow measuring element is a semiconductor type element obtained by forming at least said heating resistor on a surface of a semiconductor substrate in accordance with a micromachining technique for semiconductors and by subsequently forming a cavity in the back of the heating resistor-formed area of said semiconductor substrate; and said support member is constituted by a laminate substrate, a portion of said laminate substrate is cut out to form separate recesses, and said air flow measuring element and said intake air temperature sensing element are mounted in said recesses respectively.

3. A thermal air flow sensor according to claim 1, wherein said support member is constituted by a laminate substrate, a conductor film of said intake air temperature sensing element is interposed between layers of said laminate substrate, one end of said conductor film is exposed to the mounted position of the intake air temperature sensing element or thereabouts and is electrically connected to the intake air temperature sensing element, and an opposite end of said conductor film is electrically connected to a terminal formed on said support member.

4. A thermal air flow sensor according to claim 1, wherein said intake air temperature sensing element is disposed on an upstream side in an air flowing direction with respect to said air flow measuring element.

5. A thermal air flow sensor according to claim 1, wherein said support member is made of a glass-ceramic material or a ceramic material.

6. A thermal air flow sensor according to claim 1, wherein the resin for sealing said electric connections is selected from the group consisting of an epoxy resin, a fluorine-containing resin, and a glass material.

7. A thermal air flow sensor according to claim 1, wherein the surface of said intake air temperature sensing element is substantially flush with or lower than the surface of said air flow measuring element.

8. A thermal air flow sensor according to claim 1, wherein said intake air sensing element and said air flow measuring element are disposed on said support member in such a manner that the respective electric connections are gathered and sealed in one place on the support member.

9. A thermal air flow sensor according to claim 1, wherein slits or through holes are formed in said support member at a position corresponding to a heat conduction path which includes a case of said holder.

10. A thermal air flow sensor according to claim 1, wherein a recess is formed in the back of said support member at a position corresponding to the installed position said intake air temperature sensing element.

11. A control system for an internal combustion engine, comprising the thermal air flow sensor described in claim 1 and a controller which controls the engine in accordance with an output of the engine and an output of said intake air temperature sensing element.

12. A thermal air flow sensor having a thermal element for measuring the air flow flowing through an intake passage, the thermal air flow measuring element having a heating resistor and being disposed within the intake passage, wherein an intake air temperature sensing element for sensing air temperature in the intake passage is configured to be used for other than air flow measurement, said intake air temperature sensing element and said thermal air flow measuring element being mounted together on a single support member and are positioned within the intake passage;

wherein said support member is held by a holder attached to the wall of an intake pipe and has a structure whereby both sides of a portion of the support member located on the side apart from the wall of the intake pipe are easy to be taken away their heat by an air flow moving through the intake pipe, and on a thus heat-removed surface of the support member there are disposed said air flow measuring element and said intake air temperature sensing element; and wherein said thermal air flow measuring element and said intake air temperature sensing element are electrically connected respectively to conductors disposed on said support member, and the resulting electric connections are sealed with resin.

13. A thermal air flow sensor having a thermal element for measuring the air flow flowing through an intake passage, the thermal air flow measuring element having a heating resistor and being disposed within the intake passage, wherein an intake air temperature sensing element for sensing air temperature in the intake passage is configured to be usable for other than air flow measurement, said intake air temperature sensing element and said thermal air flow measuring element being mounted together on a single support member and are positioned within the intake passage;

wherein said support member is cantilevered by a holder attached to the wall of an intake pipe, and said intake air temperature sensing element is disposed at one end of the support member on the side opposite to the cantilevered side and at a position more away from the holder than the air flow measuring element; and wherein said thermal air flow measuring element and said intake air temperature sensing element are electrically connected respectively to conductors disposed on the support member, and the resulting electric connections are sealed with resin.

14. A thermal air flow sensor according to claim 13, wherein an electronic circuit section related to the measurement of air flow is formed on a surface of said support member on the side where the support member is cantilevered by said holder, said electronic circuit section is sealed within said holder.

15. A thermal air flow sensor having a thermal element for measuring the air flow flowing through an intake passage, the thermal air flow measuring element having a heating resistor and being disposed within the intake passage, wherein an intake air temperature sensing element is provided for sensing air temperature in the intake passage, said intake air temperature sensing element and said air flow measuring element are respectively mounted in recesses formed each individually in a support member, are positioned within the intake passage and are electrically connected respectively to conductors disposed on the support member, and the resulting electric connections are sealed with resin.

* * * * *